United States Patent
Lin et al.

(10) Patent No.: US 10,693,400 B1
(45) Date of Patent: Jun. 23, 2020

(54) DRIVING MODULE, RESTORATION METHOD AND IMAGING DEVICE

(71) Applicant: Wistron Corporation, New Taipei (TW)

(72) Inventors: Hsiao-Wu Lin, New Taipei (TW); Ching-Ping Chen, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 16/458,188

(22) Filed: Jul. 1, 2019

(30) Foreign Application Priority Data

Apr. 17, 2019 (TW) ............................. 108113318 A

(51) Int. Cl.
| | | |
|---|---|---|
| *H02P 8/08* | (2006.01) | |
| *H05K 1/11* | (2006.01) | |
| *H02K 7/116* | (2006.01) | |
| *H02K 11/33* | (2016.01) | |
| *H02K 37/24* | (2006.01) | |

(Continued)

(52) U.S. Cl.
CPC ............... *H02P 8/08* (2013.01); *H01R 39/28* (2013.01); *H02K 7/116* (2013.01); *H02K 11/33* (2016.01); *H02K 37/24* (2013.01); *H04N 5/2253* (2013.01); *H04N 5/23299* (2018.08); *H05K 1/119* (2013.01); *H02K 2211/03* (2013.01); *H02P 2203/03* (2013.01); *H05K 2201/094* (2013.01); *H05K 2201/09027* (2013.01);
(Continued)

(58) Field of Classification Search
CPC ....... H02P 8/08; H02P 2203/03; H02K 11/33; H02K 7/116; H02K 37/24; H02K 2211/03; H04N 5/2253; H04N 5/23299; H01R 39/28; H05K 2201/09027; H05K 2201/09418; H05K 2201/094; H05K 1/119; H05K 2201/09445; H05K 2201/0939
USPC .................................................. 348/370–374
See application file for complete search history.

(56) References Cited

U.S. PATENT DOCUMENTS

| | | | |
|---|---|---|---|
| 2019/0097495 A1* | 3/2019 | Dion ........................ | F16H 1/28 |
| 2019/0215463 A1* | 7/2019 | Shirane .................... | G05D 3/12 |

FOREIGN PATENT DOCUMENTS

| | | |
|---|---|---|
| CN | 200983031 | 11/2007 |
| CN | 204110366 | 1/2015 |

OTHER PUBLICATIONS

"Office Action of Taiwan Counterpart Application," dated Dec. 6, 2019, p. 1-p. 9.

* cited by examiner

*Primary Examiner* — Yogesh K Aggarwal
(74) *Attorney, Agent, or Firm* — JCIPRNET

(57) ABSTRACT

A driving module including a circuit board, a rotating member rotatably disposed on the circuit board, and a power source mechanically linked to the rotating member and electrically connected to the control circuit is provided. The circuit board has a control circuit, a first conductive portion, and a plurality of second conductive portions. The first conductive portion and the second conductive portions are electrically connected to the control circuit respectively. The rotating member has a first abutment and a second abutment electrically connected to each other. The power source is controlled by the control circuit to rotate the rotating member relative to the circuit board. The first abutment constantly abuts the first conductive portion, and the second conductive portions are on a rotating path of the second (Continued)

abutment. A restoration method and an imaging device are also provided.

18 Claims, 9 Drawing Sheets

(51) Int. Cl.
*H04N 5/225* (2006.01)
*H04N 5/232* (2006.01)
*H01R 39/28* (2006.01)

(52) U.S. Cl.
CPC ................ *H05K 2201/0939* (2013.01); *H05K 2201/09418* (2013.01); *H05K 2201/09445* (2013.01)

DRIVING MODULE, RESTORATION METHOD AND IMAGING DEVICE

CROSS-REFERENCE TO RELATED APPLICATION

This application claims the priority benefit of Taiwan patent application serial no. 108113318, filed on Apr. 17, 2019. The entirety of the above-mentioned patent application is hereby incorporated by reference herein and made a part of this specification.

BACKGROUND OF THE INVENTION

1. Field of the Invention

The invention relates to a driving module, a restoration method, and an imaging device.

2. Description of Related Art

As broadband network becomes more and more popular, the demands for directly transmitting audio and video files on a network for face-to-face video messaging have also been increasing drastically, and one of the main devices for such purpose is the webcam. For the convenience of use, the ease to make adjustment, and the stability of the lens, a webcam is usually provided with a base. In addition, a related movement mechanism may be used together, so that an imaging module may be assembled to the movement mechanism to be operated rotatably. In this way, the user is allowed to adjust the shooting angle of the imaging module.

To ensure the controllability and precision of movement, after the webcam is activated, a built-in control circuit may firstly drive and restore the imaging module. Generally, a sensing switch is installed in the device body, and after startup, the control circuit may drive the image module to move continuously through the movement mechanism until the sensing switch is triggered as a criterion for determining that the camera module has been restored.

However, such a restoring operation is usually time and labor-consuming and inefficient. In other words, the user may have to wait for a period of time for the webcam to be initialized after turning on the webcam. Therefore, the user experience is not favorable.

SUMMARY OF THE INVENTION

The invention provides a driving module, a restoration method, and an imaging device capable of effectively reducing processes and time for initialization.

A driving module according to an embodiment of the invention includes a circuit board, a rotating member, and a power source. The circuit board has a control circuit, a first conductive portion, and second conductive portions separated from the first conductive portion respectively. The first and second conductive portions are respectively electrically connected to the control circuit. The rotating member is rotatably disposed on the circuit board, and has a first abutment and a second abutment electrically conductive to each other. The power source is mechanically linked to the rotating member, electrically connected to the control circuit, and controlled by the control circuit to rotate the rotating member relative to the circuit board. The first abutment constantly abuts against the first conductive portion, and the second conductive portions are located on a rotating path of the second abutment. After the driving module is activated, the control circuit determines whether to drive the rotating member and a rotating process of the rotating member according to electric states of the second conductive portions.

A restoration method according an embodiment of the invention is suitable for a driving module. The driving module includes a circuit board, a rotating member, and a power source. The circuit board has a control circuit and a first conductive portion and second conductive portions separated from each other. The first and second conductive portions are respectively electrically connected to the control circuit. The rotating member is rotatably disposed on the circuit board and has a first abutment and a second abutment conductive to each other. The power source is mechanically linked to the rotating member, electrically connected to the control circuit. The first abutment constantly abuts against the first conductive portion, and the second conductive portions are located on a rotating path of the second abutment. The restoration method includes activating the driving module and determining electric potentials of the second conductive portions by the control circuit. After the driving module is activated, the second conductive portions are assigned same electric potentials. The electric potential of the second conductive portion is changed when the second conductive portion is electrically conductive to the first conductive portion through the second abutment and the first abutment. The electric potential of the second conductive portion is not changed when the second conductive portion is not electrically conductive to the first conductive portion. In the process of determining the electric potential of the second conductive portion by the control circuit, when the electric potentials of the second conductive portions are the same, the control circuit rotates the rotating member relative to the circuit board through the power source until the second abutment travels to one of the second conductive portions to change the electric potential of the one of the second conductive portions. When the electric potential of one of the second conductive portions is changed, the control circuit determines a location of the one of the second conductive portions on the circuit board to determine whether to drive the rotating member and a rotating process of the rotating member.

The imaging device according to an embodiment of the invention includes a driving module and an imaging module. The driving module includes a circuit board, a rotating member, and a power source. The circuit board has a control circuit, a first conductive portion, and second conductive portions separated from the first conductive portion respectively. The first and second conductive portions are respectively electrically connected to the control circuit. The rotating member is rotatably disposed on the circuit board and has a first abutment and a second abutment electrically conductive to each other. The power source is mechanically linked to the rotating member, electrically connected to the control circuit. The first abutment constantly abuts against the first conductive portion, and the second conductive portions are located on a rotating path of the second abutment. The imaging module is disposed on the rotating member and electrically connected to the control circuit. After the imaging device is activated, the control circuit drives the rotating member to restore the imaging module according to electric states of the second conductive portions.

Based on the above, in the driving module, the first conductive portion and the second conductive portions are distributed on the circuit board, the first abutment and the second abutment electrically conductive to each other are disposed on the rotating member, the first abutment constantly abuts against the first conductive portion, and the second conductive portions are located on the rotating path of the second abutment. Accordingly, during the rotating process of the rotating member relative to the circuit board, the electric state of the second conductive portion may be changed by being electrically conductive to the first conductive portion through the first abutment and the second abutment when the second abutment travels to the second conductive portion.

Accordingly, the control circuit may acquire the rotating state of the rotating member by determining the electric states of the second conductive portions. In other words, the positioning and locating of the rotating member during rotation is obtained through the second conductive portions of the circuit board to serve as the reference for the stroke of restoring the rotating member.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
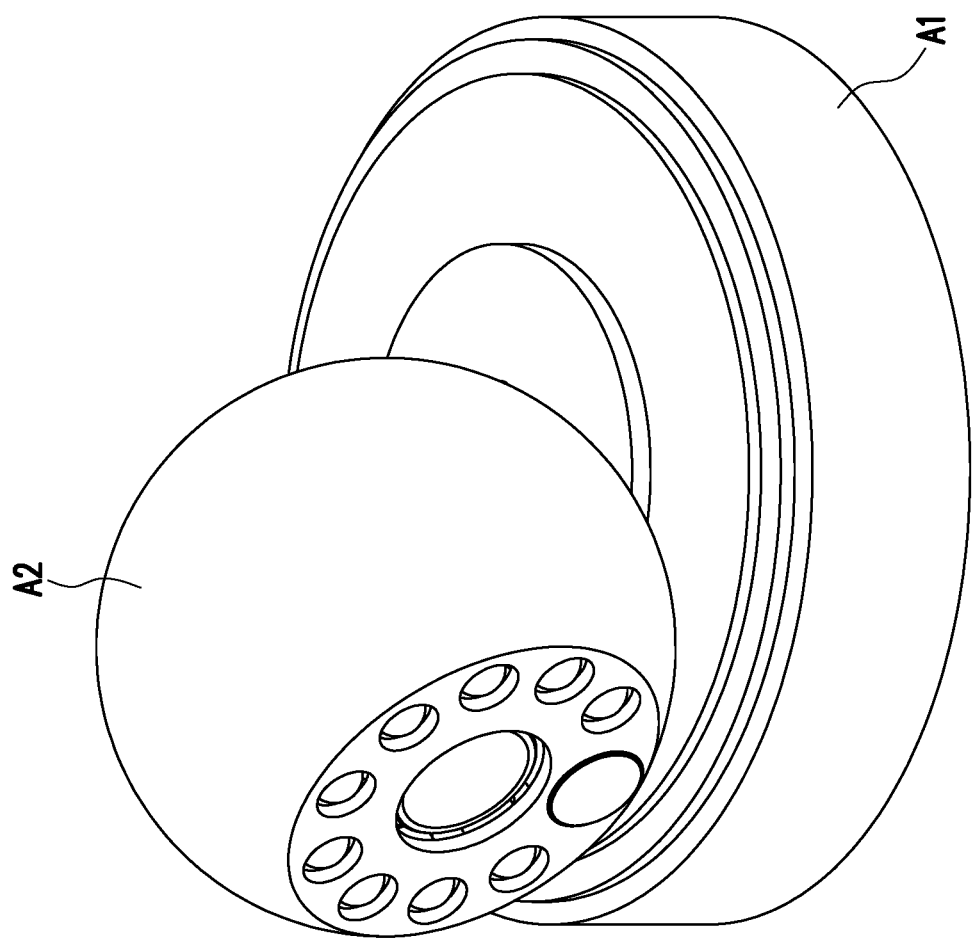
FIG. 1 is a schematic view illustrating an imaging device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
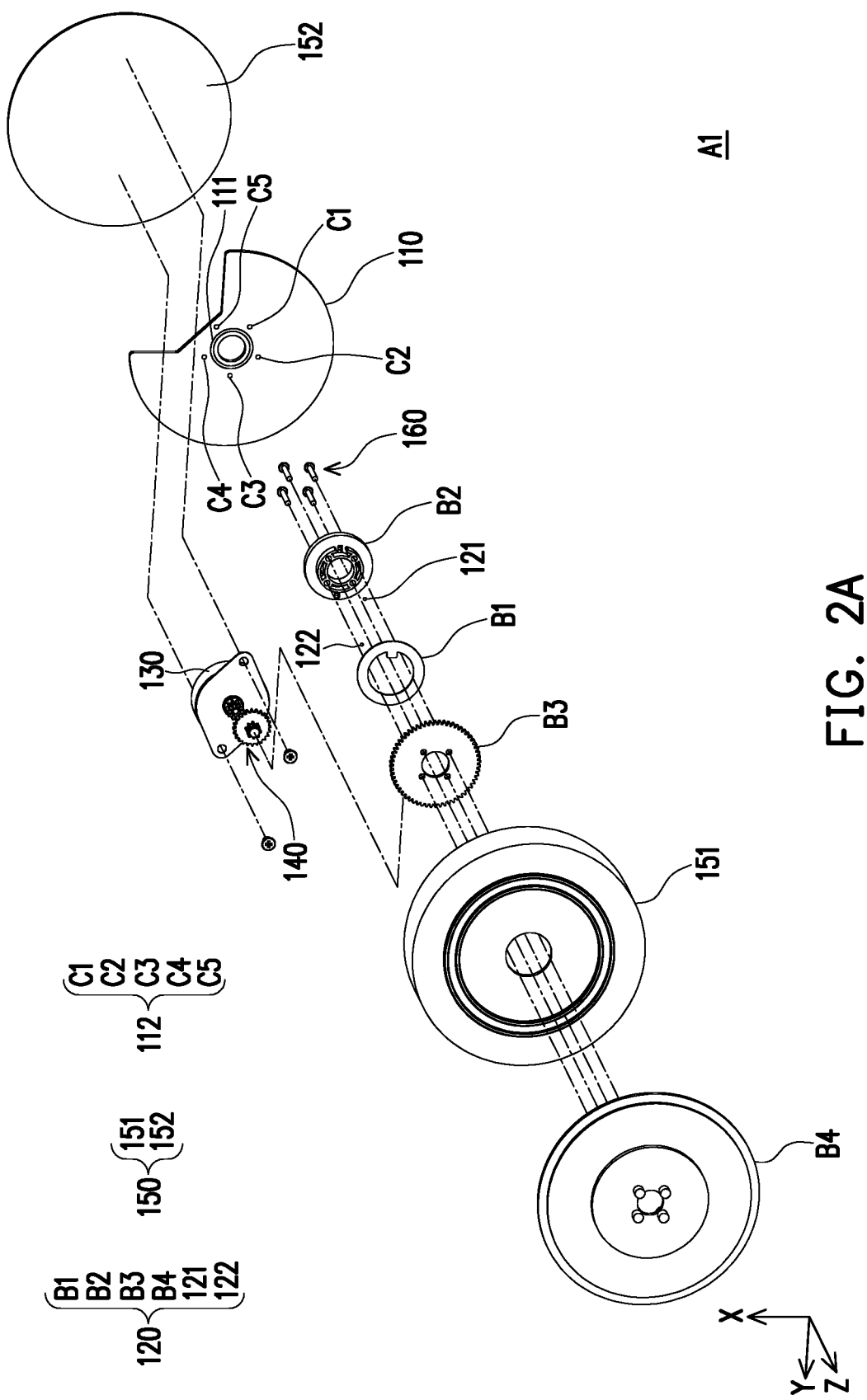
FIGS. 2A and 2B are respectively exploded views of some components of the imaging device of FIG. 1.
Figure 2B:
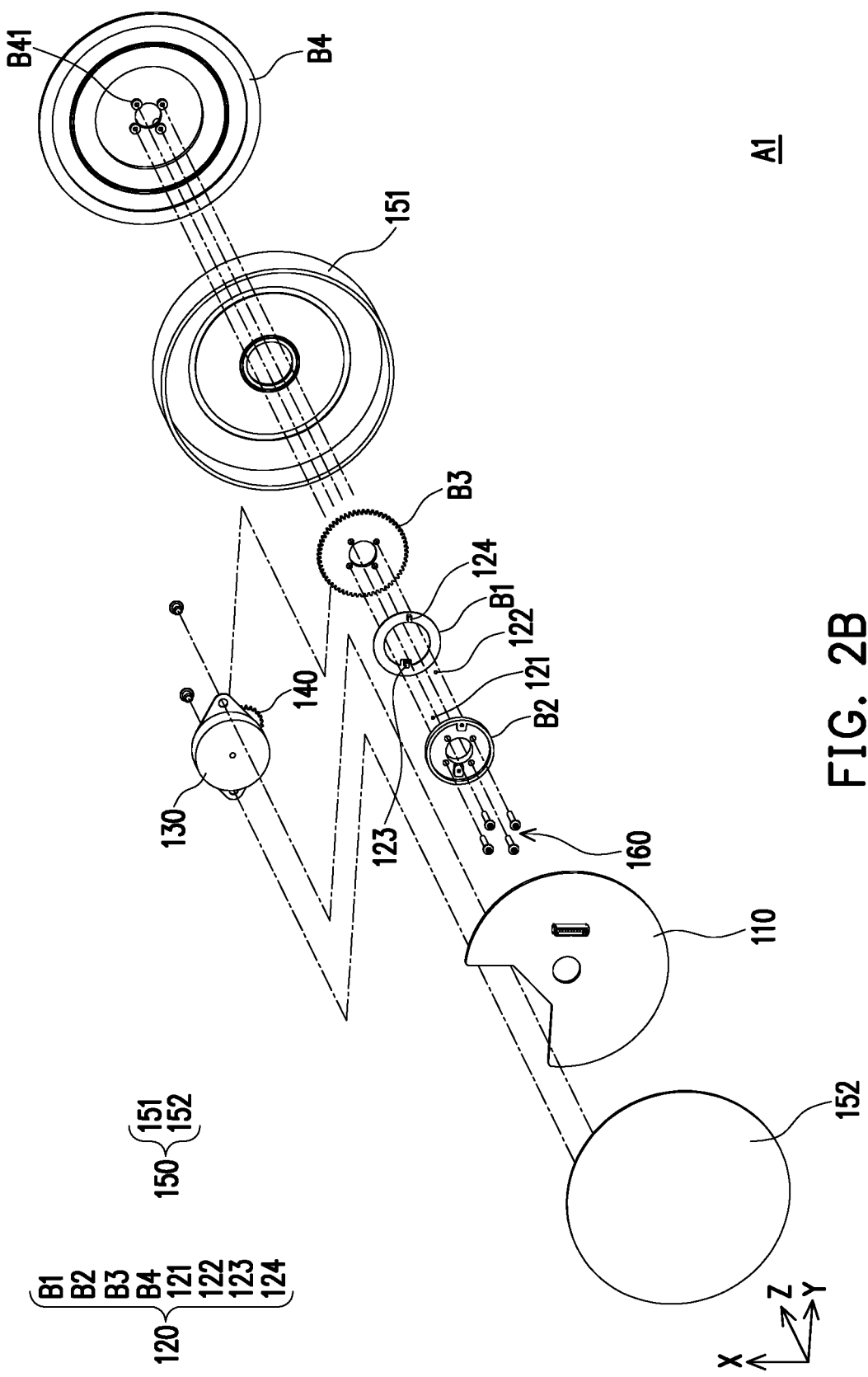

FIG. 1 is a schematic view illustrating an imaging device according to an embodiment of the invention. FIGS. 2A and 2B are respectively exploded views of some components of the imaging device of FIG. 1. Referring to FIGS. 1, 2A, and 2B, in the embodiment, an imaging device 100 is a webcam, for example, and includes a main body A1 and an imaging module A2. The imaging module A2 is disposed on and controlled by the main body A1, so that the main body A1 is able to drive the imaging module A2 to perform a rotary motion. Meanwhile, a Cartesian coordinate system X-Y-Z is provided herein in order to describe the components easily.

The main body A1 includes a circuit board 110, a rotating member 120, a power source 130, a transmission assembly 140, a housing 150, and a fastener 160. As shown in FIGS. 2A and 2B, the housing 150 includes an upper housing 151 and a lower housing 152 assembled to each other. The power source 130 and the circuit board 110 are disposed on the lower housing 152. The rotating member 120 includes a conductive component B1, a rotating component B2, a gear B3, a carrier B4, a first abutment 121, and a second abutment 122. The transmission assembly 140 is a gear set, for example, and is disposed synchronously with the power source 130 and coupled to the gear B3. The fastener 160 is configured to assemble the conductive component B1, the rotating component B2, the gear B3, and the carrier B4 together along Z-axis and locate the center of the circuit board 110 on Z-axis. Meanwhile, in the assembled imaging device 100, only the carrier B4 of the rotating member 120 is kept outside the housing 150 and rotatably lean against the upper housing 151, and the imaging module A2 may be assembled on the carrier B4. With the above configuration, the power source 130 may drive the rotating member 120 to rotate about Z-axis relative to the circuit board 110 through the transmission module 140. In other words, Z-axis is considered as a rotating axis of the rotating member 120.

Figure 2C:
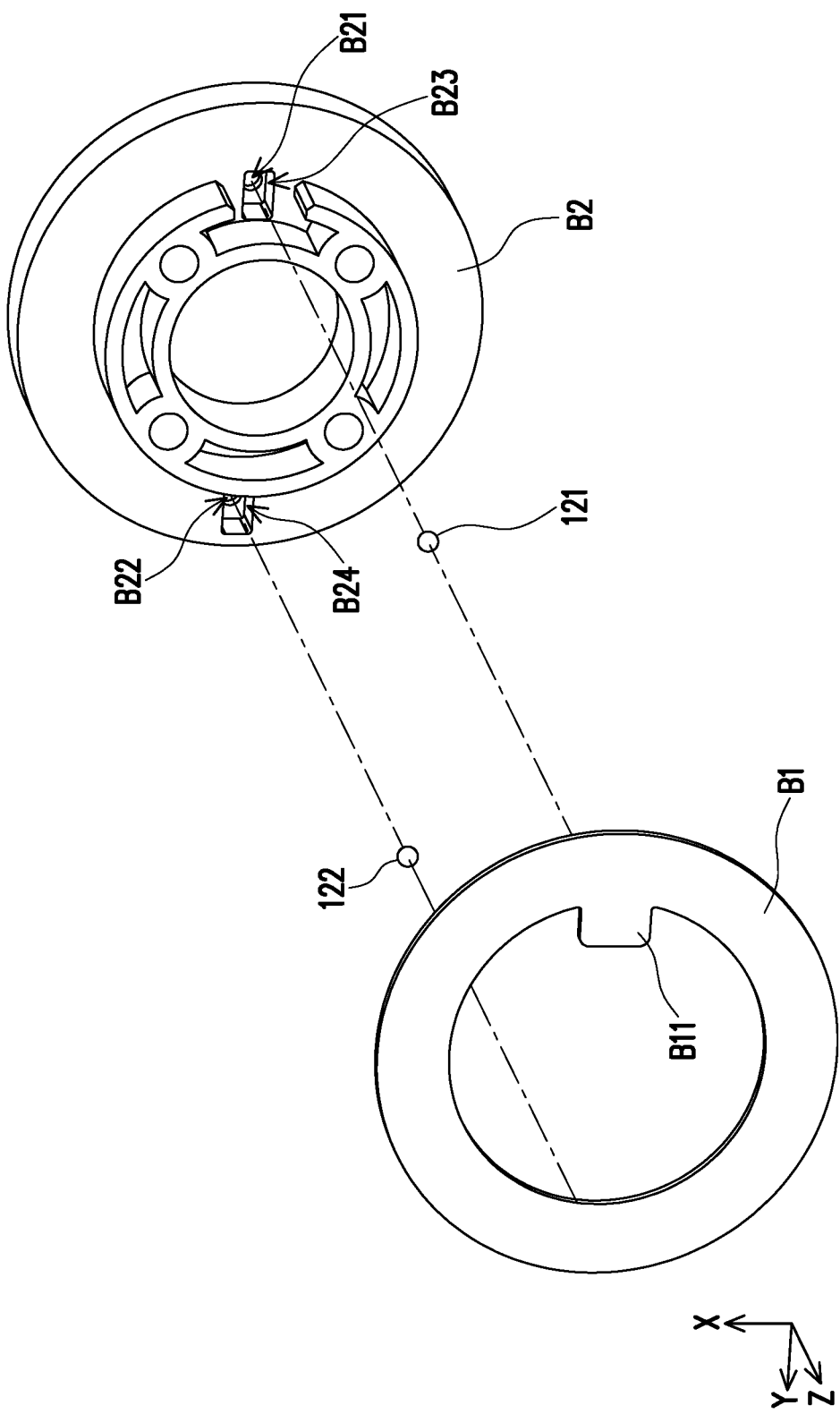
FIG. 2C is a schematic partially enlarged view of some components of FIG. 2A.
Figure 2D:
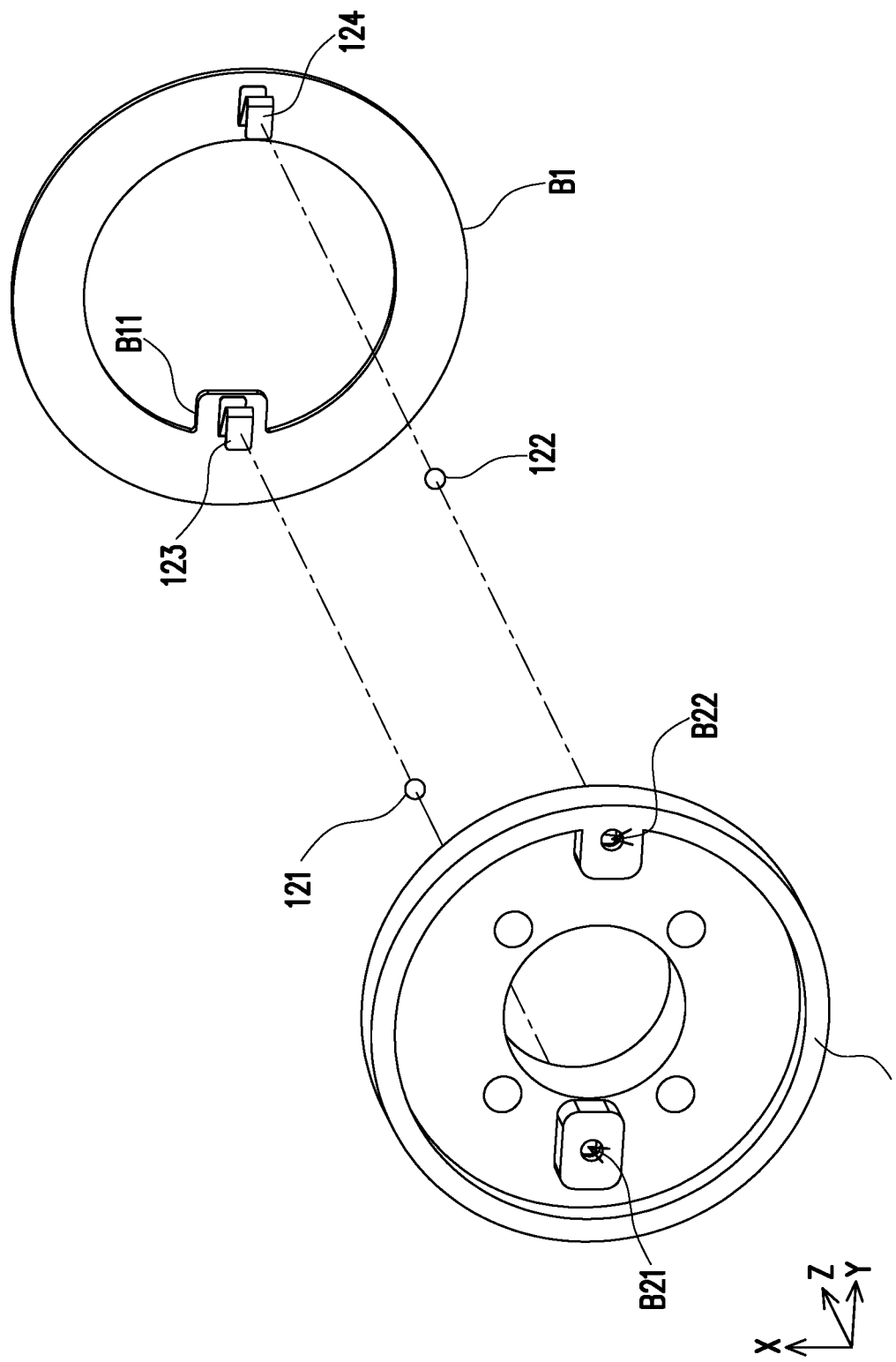
FIG. 2D is a schematic partially enlarged view of some components of FIG. 2B.

FIG. 2C is a schematic partially enlarged view of some components of FIG. 2A. The two figures are shown in the same perspective. FIG. 2D is a schematic partially enlarged view of some components of FIG. 2B. The two figures are shown in the same perspective. Referring to FIGS. 2C and 2D, in the embodiment, the rotating member B2 has a pair of recesses B23 and B24 and apertures B21 and B22 located in the recesses B23 and B24. The first abutment 121 and the second abutment 122 are respectively conductive balls and located in the apertures B21 and B22. Here, the first abutment 121 and the second abutment 122 are partially exposed by the apertures B21 and B22. However, since the inner diameters of the apertures B21 and B22 are smaller than the outer diameters of the balls, the first abutment 121 and the second abutment 122 are unable to pass through the apertures B21 and B22. In this way, it is ensured that the first abutment 121 and the second abutment 122 are limited in the apertures B21 and B22 while remaining rollable. In addition, the conductive component B1 is annular and disposed on the rotating component B2. Besides, the rotating member 120 further includes a pair of conductive elastic pieces 123 and 124 respectively extending from the conductive component B1 to the rotating component B2. The conductive elastic piece 124 is disposed at the annular portion of the conductive component B1, and the conductive elastic piece 123 is disposed at a convex portion B11 of the conductive component B1. In addition, when Z-axis serves as reference, the distance of the conductive elastic piece 123 located at the convex portion B11 relative to Z-axis is smaller than the distance of the conductive elastic piece 124 located at the annular portion relative to Z-axis.

Moreover, the conductive elastic pieces 123 and 124 are respectively inserted into the recesses B23 and B24 to correspondingly abut against the first abutment 121 and the second abutment 122, thereby continuously pressing the first abutment 121 and the second abutment 122 onto the circuit board 110. Accordingly, the first abutment 121, the conductive elastic piece 123, the conductive component B1, the conductive elastic piece 124, and the second abutment 122 form a conductive path. In other words, the first abutment 121 and the second abutment 121 are maintained in a conductive state. In addition, as the rotating component B2, the conductive component B1, and the gear B3 synchronously rotate, the first abutment 121 and the second abutment 122 are also rotated with the rotating component B2 and roll on the circuit board 110.

Figure 3:
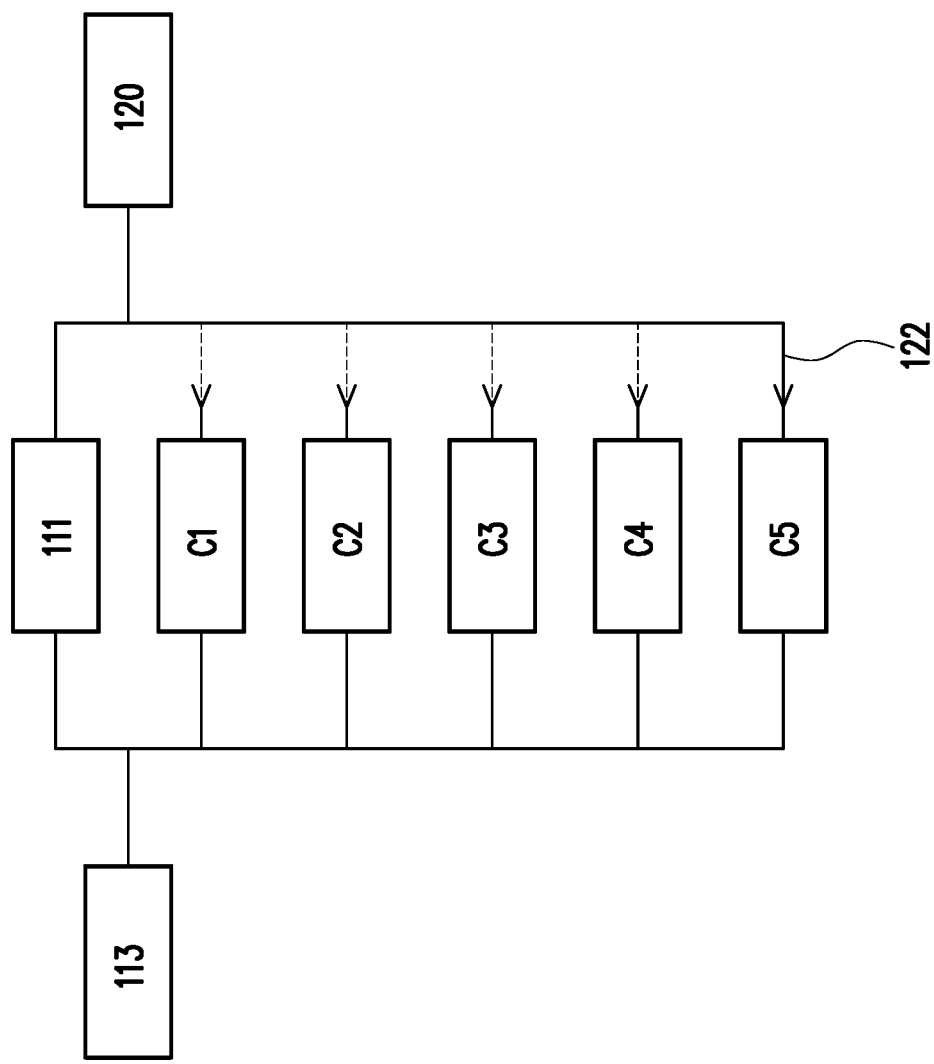
FIG. 3 is a schematic diagram of an electrical relationship of a driving module.
Figure 4:
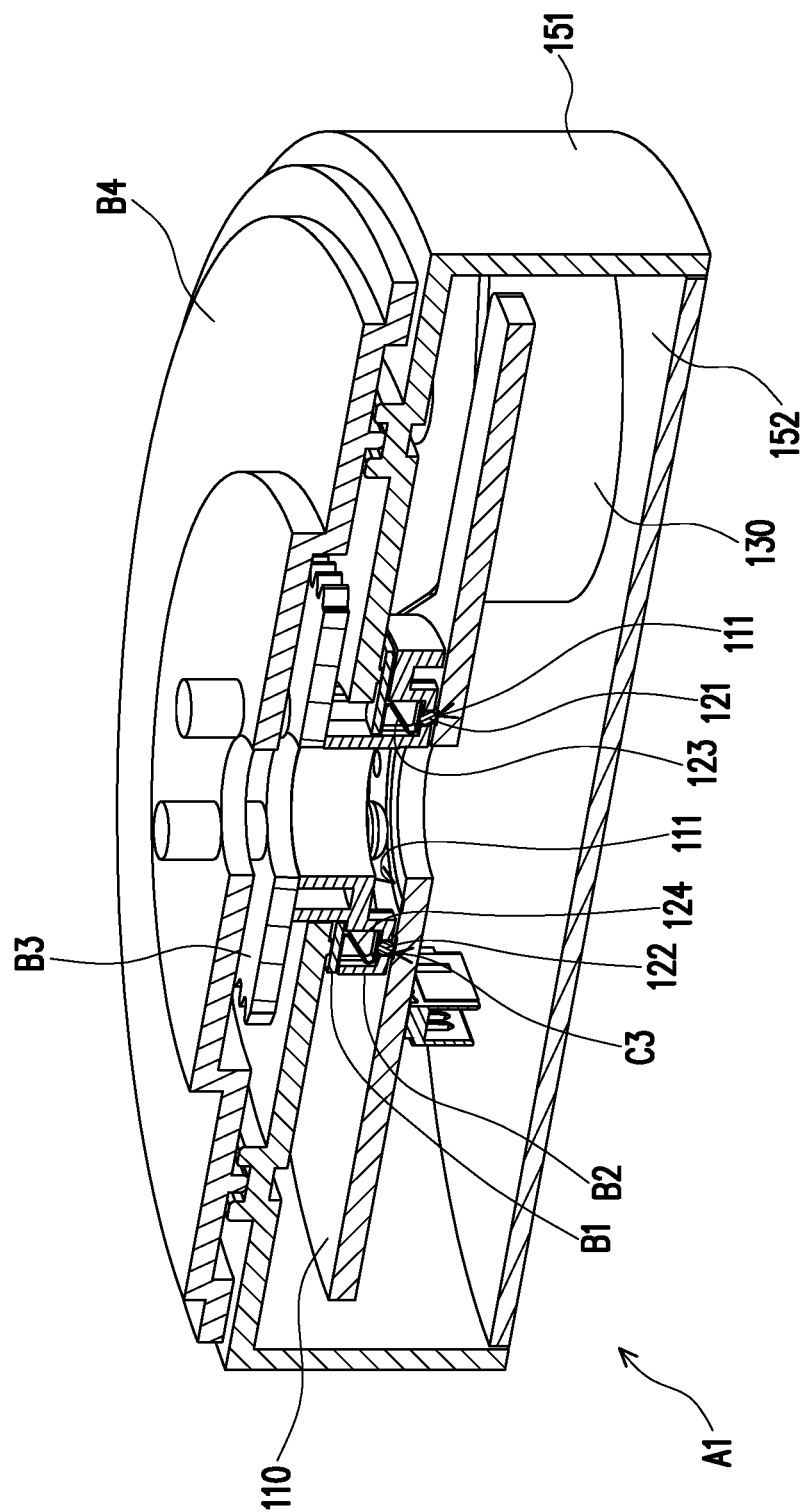
FIG. 4 is a partial cross-sectional view of the imaging device of FIG. 1.

FIG. 3 is a schematic diagram of an electrical relationship of a driving module. FIG. 4 is a partial cross-sectional view of the imaging device of FIG. 1. Referring to FIGS. 2, 3, and 4, in the embodiment, the circuit board 110 has a control circuit 113, a first conductive portion 111, and a plurality of second conductive portions 112. The first conductive portion 111 and the second conductive portions 112 are respectively electrically connected to the control circuit 113, and the control circuit 113 is electrically connected to the power source 130 and the imaging module A2. Here, the control circuit 113 includes relevant wires and electronic components on the circuit board 110 that are not shown herein. Besides, to correspond to the movement paths of the first abutment 121 and the second abutment 122, the first conductive portion 111 of the embodiment is a pad surrounding the rotating axis (Z-axis) and having a closed profile, while the second conductive portions 112 are a plurality of pads arranged to surround and outside the pad having a closed profile. In addition, as an exemplary example, the second conductive portions 112 are further separately arranged as second conductive portions C1 to C5.

As described above, the first abutment 121 and the second abutment 122 roll with the rotating component B2 on the circuit board 110. In addition, the movement (rolling) paths of the first conductive portion 111 and the first abutment 121 are the same, and the second conductive portions C1 to C5 are located on the movement (rolling) path of the second abutment 122. In other words, during the rotation of the rotating member 120, the first abutment 121 constantly abuts against the first conductive portion 111. Meanwhile, the solid and dotted lines shown in FIG. 3 show that the second abutment 122 may travel through the second conductive portions C1 to C5 and also illustrate a state in which the second abutment 122 currently travels to the second conductive portion C5.

Figure 5:
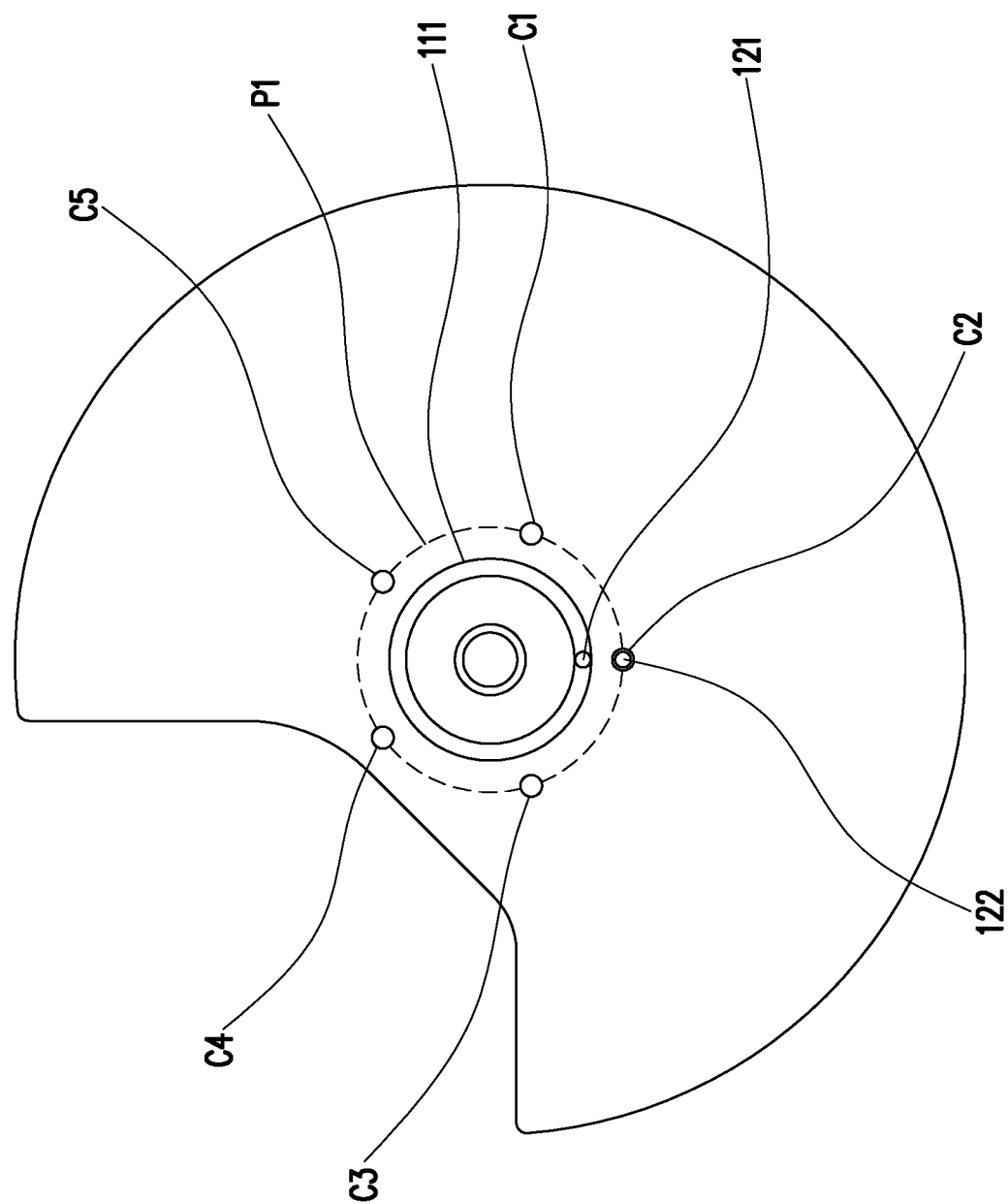
FIG. 5 is a top view of a circuit board of a driving module.
Figure 6A:
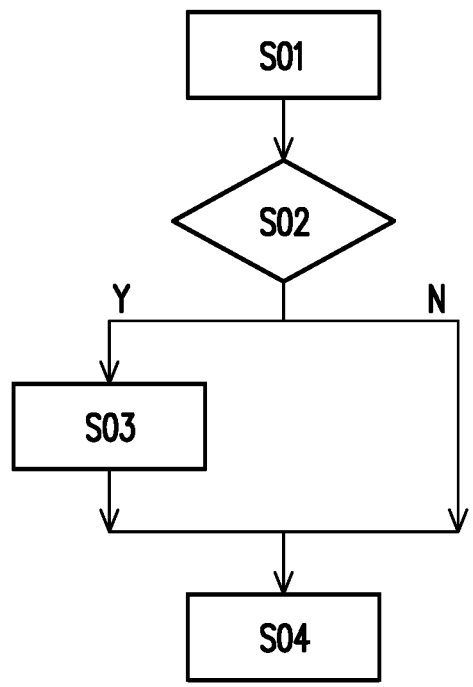
FIGS. 6A and 6B are respectively flowcharts of a restoration method of a driving module.
Figure 6B:
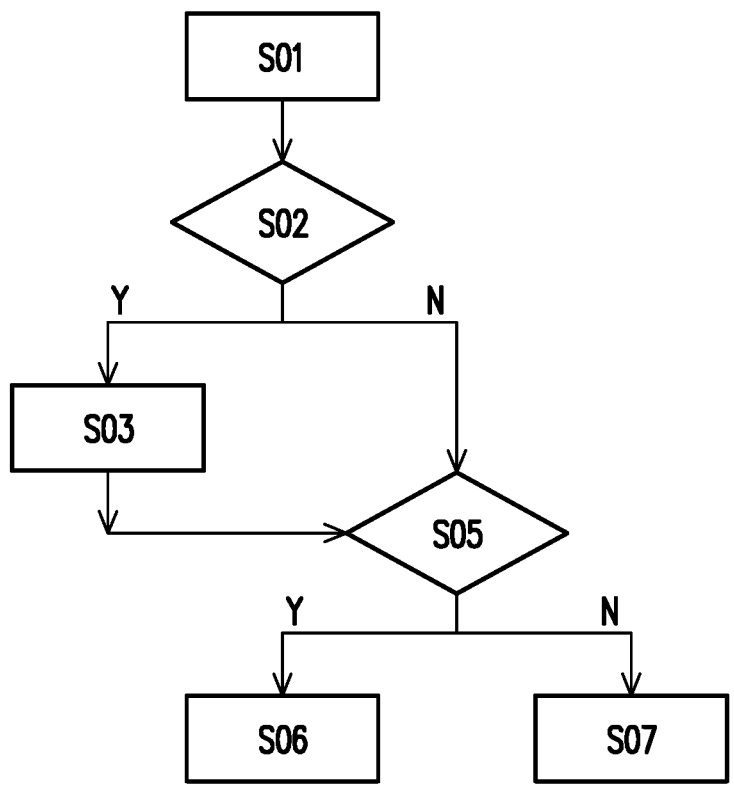

FIG. 5 is a top view of a circuit board of a driving module. FIGS. 6A and 6B are respectively flowcharts of a restoration method of a driving module. Referring to FIGS. 5 and 6A, firstly, in Step S01 of the embodiment, the driving module A1 of the imaging device 100 is activated. At this time, the second conductive portions C1 to C5 of the circuit board 110 are assigned the same electric potentials. In addition, the power source 130 includes a stepping motor, and the locations of the second conductive portions C1 to C5 on the circuit board 110 correspond to step angles of the stepping motor. Accordingly, the control circuit 113 is able to learn the locations of the second conductive portions C1 to C5 on the circuit board 110 according to the corresponding relationship between the second conductive portions C1 to C5 and the step angles. In other words, the locations of the second conductive portions C1 to C5 on the circuit board 110 can thus be coordinated with the step angles.

Then, in Step S02, the control circuit 113 further determines electric states of the second conductive portions C1 to C5. When the second conductive portions C1 to C5 have the same potentials, it means that the second abutment 122 does not abut against any of the second conductive portions C1 to C5. In such case, Step S03 is performed. That is, the control circuit 113 drives the rotating member 120 to rotate relative to the circuit board 110 through the power source 130 until the second abutment 122 travels to one of the second conductive portions C1 to C5 and generate the conductive path of the first abutment 121, the conductive elastic piece 123, the conductive component B1, the conductive elastic piece 124, and the second abutment 122, thereby changing the electric potential of the one of the second conductive portions C1 to C5. At this time, based on which of the second conductive portions C1 to C5 has a change in electric potential, the control circuit 113 may acquire the location of the rotating member 120. Therefore, Step S04 may be carried out. That is, the control circuit 113 drives the rotating member 120 through the power source 130 to rotate the rotating member 120 directly to an initial location to complete the restoration operation, i.e., to complete the restoration of the imaging module A2.

Comparatively, when there is inconsistency among the potentials of the second conductive portions C1 to C5, such inconsistency indicates that the second abutment 122 has been abutting against one of the second conductive portions C1 to C5, so the control circuit board 113 may learn the rotating state of the rotating member 120. Consequently, Step S04 may be carried out accordingly to complete the restoration of the imaging module A2.

Here, the first conductive portion 111 is assigned a ground potential. Therefore, when the second abutment 122 travels to one of the second conductive portions C1 to C5, the electric potential of the one of the second conductive portions C1 to C5 may be changed to the ground potential and be easily distinguished by the control circuit 113.

It should be noted that since the second conductive portions C1 to C5 are located with coordinates through the corresponding relationship with the step angles of the stepping motor, in an embodiment, the initial location of the rotating member 120 may be set at a specific location, and the specific location may be one of the second conductive portions C1 to C5 to which the second abutment 122 travels. Of course, under the premise that coordinates have been assigned for location, the rotating process of the stepping motor is known. Therefore, in another embodiment, the initial location of the rotating member 120 may also be set among the second conductive portions C1 to C5 or any location on a path P1. Here, the second abutment 122 moves along the path P1.

Referring to FIGS. 5 and 6B, Steps S01 to S03 have been described above. However, what differs is that determining the location of one of the second conductive portions C1 to C5 on the circuit board 110 by the control circuit 113 further includes that, in Step S05, the control circuit 113 further determines whether the one of the second conductive portions C1 to C5 at this time is the initial location set in default. If the one of the second conductive portions C1 to C5 at this time is the initial location set in default, Step S06 is performed. That is, the rotating member 120 is not further driven, and the restoration method is ended. If the one of the second conductive portions C1 to C5 at this time is not the initial location set in default, Step S07 is performed, the control circuit 113 drives the rotating member 120 to the initial location through the power source 130.

Referring to FIG. 5, as an example, it is set in default that the stepping stroke of the stepping motor is 1 step=1.8 degrees. Accordingly, the rotating process (the path P1) of the rotating member 120 is 1 cycle=200 steps, which is equivalent to the arrangement of disposing one of the second conductive portions C1 to C5 every 40 steps. In addition, it is set in default that the second conductive portion C2 serves as the initial location of the rotating member 120 and the imaging module A2 on the rotating member 120. In addition, it is assumed that the second abutment 122 is located between the second conductive portion C1 and the second conductive portion C2 when the driving module A1 is started.

Accordingly, in Step S02, the control circuit 113 may firstly make a determination according to the potential states of the second conductive portions C1 to C5. At this time, the second abutment 122 is on the path P1, but does not abut against any of the second conductive portions C1 to C5. Therefore, the second conductive portions C1 to C5 remain at the same potentials. As a consequence, Step S03 is performed. That is, the rotating member 120 is rotated relative to the circuit board 110. Since the rotating direction of the rotating member 120 is not particularly limited herein, there are two possibilities. One of the possibilities is that the rotating member 120 rotates in the counter-clockwise direction so that the second abutment 122 travels to the second conductive portion C1 and lowers the potential of the second conductive portion C1. Also, the control circuit 113 may acquire the state and thus perform Step S07. That is, the control circuit 113 drives the rotating member 120 to be restored to the initial location, i.e., rotating the second abutment 122 back to the second conductive portion C2. The other possibility is that, in Step S03, the second abutment 122 travels to the second conductive portion C2, so that when the control circuit 113 acquires the state in Step S05, the control circuit 113 may then perform Step S06 to end the restoration method of the embodiment.

Based on the above, it can be known that the number of the second conductive portions may be correspondingly adjusted according to the requirements. A greater number of the second conductive portions indicates a smaller angle which the rotating member needs to rotate in Step S03. However, the designer shall still pursue a favorable design according to the requirements such as driving processes, manufacturing cost, and driving efficiency, etc. Besides, since the imaging module is driven through rotation, the locations of the first conductive portion, the second conductive portions and the corresponding first abutment and the second abutment are not limited. The embodiment is applicable as long as the locations meet the corresponding rotating path.

In view of the foregoing, in the driving module, the first conductive portion and the second conductive portions are distributed on the circuit board, the first abutment and the second abutment electrically conductive to each other are disposed on the rotating member, the first abutment constantly abuts against the first conductive portion, and the second conductive portions are located on the rotating path of the second abutment. Accordingly, during the rotating process of the rotating member relative to the circuit board, the electric state of the second conductive portion may be changed by being electrically conductive to the first conductive portion through the first abutment and the second abutment when the second abutment travels to the second conductive portion.

Accordingly, the control circuit may acquire the rotating state of the rotating member by determining the electrical states of the second conductive portions. In other words, the positioning and locating of the rotating member during rotation is obtained through the second conductive portions of the circuit board to serve as the reference for the stroke of restoring the rotating member. In addition, since the second conductive portions are disposed, the rotating angle of the rotating member and the sensing time of the control circuit can be reduced, thereby facilitating the efficiency of restoration.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A driving module, comprising:
a circuit board, having a control circuit, a first conductive portion, and a plurality of second conductive portions separated from the first conductive portion respectively, wherein the first conductive portion and the second conductive portions are respectively electrically connected to the control circuit;
a rotating member, rotatably disposed on the circuit board and having a first abutment and a second abutment electrically conductive to each other; and
a power source, mechanically linked to the rotating member, electrically connected to the control circuit, and controlled by the control circuit to rotate the rotating member relative to the circuit board, wherein the first abutment constantly abuts against the first conductive portion, the second conductive portions are located on a rotating path of the second abutment, and after the driving module is activated, the control circuit determines whether to drive the rotating member and a rotating process of the rotating member according to electric states of the second conductive portions.

2. The driving module as claimed in claim 1, wherein the rotating member rotates about a rotating axis relative to the circuit board, the first conductive portion is a pad surrounding the rotating axis and having a closed profile, and the second conductive portions are a plurality of pads arranged to surround and outside the pad having the closed profile.

3. The driving module as claimed in claim 1, wherein after the driving module is activated, the second conductive portions are assigned same electric potentials, and when the second abutment travels to one of the second conductive portions, the one of the second conductive portions is electrically conductive to the first conductive portion through the second abutment and the first abutment, so as to change the electric potential of the one of the second conductive portions.

4. The driving module as claimed in claim 3, wherein the first conductive portion is grounding.

5. The driving module as claimed in claim 1, wherein the rotating member comprises:
a rotating component, having a pair of apertures, wherein the first abutment and the second abutment are a pair of conductive balls respectively located in the pair of apertures;
a conductive component, assembled to the rotating component; and
a pair of conductive elastic pieces, extending from the conductive component to the rotating component and pressing the pair of conductive balls onto the circuit board, wherein the pair of conductive balls are electrically conductive to each other through the pair of conductive elastic pieces and the conductive component.

6. The driving module as claimed in claim 5, wherein the rotating member further comprises a gear assembled coaxially with the rotating component, the conductive component is disposed between the rotating member and the gear, and the power source is coupled to the gear.

7. The driving module as claimed in claim 1, wherein the power source comprises a stepping motor, and locations of the second conductive portions on the circuit board correspond to step angles of the stepping motor.

8. A restoration method, suitable for a driving module comprising a circuit board, a rotating member, and a power source, wherein the circuit board has a control circuit, a first conductive portion, and a plurality of second conductive portions separated from the first conductive portion respectively, the first conductive portion and the second conductive portions are respectively electrically connected to the control circuit, a rotating member is rotatably disposed on the circuit board and has a first abutment and a second abutment electrically conductive to each other, the power source is mechanically linked to the rotating member and electrically connected to the control circuit, the first abutment constantly abuts against the first conductive portion, and the second conductive portions are located on a rotating path of the second abutment, the restoration method comprising:

activating the driving module, wherein the second conductive portions are assigned same electric potentials, the electric potential of the second conductive portion is changed when the second conductive portion is electrically conductive to the first conductive portion through the second abutment and the first abutment, and the electric potential of the second conductive portion is not changed when the second conductive portion is not electrically conductive to the first conductive portion; and the control circuit determines the electric potentials of the second conductive portions, wherein when the electric potentials of the second conductive portions are the same, the control circuit rotates the rotating member relative to the circuit board through the power source until the second abutment travels to one of the second conductive portions to change the electric potential of the one of the second conductive portions, and when the electric potential of one of the second conductive portions is changed, the control circuit determines a location of the one of the second conductive portions on the circuit board to determine whether to drive the rotating member and a rotating process of the rotating member.

9. The restoration method as claimed in claim 8, wherein determining the location of the one of the second conductive portions on the circuit board by the control circuit comprises:

ending the restoration method when the one of the second conductive portions corresponds to an initial location of the rotating member; and driving the rotating member to rotate relative to the circuit board to the initial location through the power source by the control circuit when the one of the second conductive portions does not correspond to the initial location of the rotating member.

10. The restoration method as claimed in claim 8, wherein the power source comprises a stepping motor, and locations of the second conductive portions on the circuit board correspond to step angles of the stepping motor.

11. The restoration method as claimed in claim 8, wherein after the driving module is activated, the first conductive portion is assigned a ground potential.

12. An imaging device, comprising:
a driving module, comprising:
a circuit board, having a control circuit, a first conductive portion, and a plurality of second conductive portions separated from the first conductive portion respectively, wherein the first conductive portion and the second conductive portions are respectively electrically connected to the control circuit;

a rotating member, rotatably disposed on the circuit board and having a first abutment and a second abutment electrically conductive to each other; and a power source, mechanically linked to the rotating member, electrically connected to the control circuit, and controlled by the control circuit to rotate the rotating member relative to the circuit board, wherein the first abutment constantly abuts against the first conductive portion, and the second conductive portions are located on a rotating path of the second abutment; and an imaging module, disposed on the rotating member and electrically connected to the control circuit, wherein after the imaging device is activated, the control circuit drives the rotating member to restore the imaging module according to electric states of the second conductive portions.

13. The imaging device as claimed in claim 12, wherein the rotating member rotates about a rotating axis relative to the circuit board, the first conductive portion is a pad surrounding the rotating axis and having a closed profile, and the second conductive portions are a plurality of pads arranged to surround and outside the pad having the closed profile.

14. The imaging device as claimed in claim 12, wherein after the imaging device is activated, the second conductive portions are assigned same electric potentials, and when the second abutment travels to one of the second conductive portions, the one of the second conductive portions is electrically conductive to the first conductive portion through the second abutment and the first abutment, so as to change the electric potential of the one of the second conductive portions.

15. The imaging device as claimed in claim 14, wherein the first conductive portion is grounding.

16. The imaging device as claimed in claim 12, wherein the rotating member comprises:

a rotating component, having a pair of apertures, wherein the first abutment and the second abutment are a pair of conductive balls respectively located in the pair of apertures;

a conductive component, assembled to the rotating component; and a pair of conductive elastic pieces, extending from the conductive component to the rotating component and pressing the pair of conductive balls onto the circuit board, wherein the pair of conductive balls are electrically conductive to each other through the pair of conductive elastic pieces and the conductive component.

17. The imaging device as claimed in claim 12, wherein the rotating member further comprises a gear assembled coaxially with the rotating component, the conductive component is disposed between the rotating member and the gear, and the power source is coupled to the gear.

18. The imaging device as claimed in claim 12, wherein the power source comprises a stepping motor, and locations of the second conductive portions on the circuit board correspond to step angles of the stepping motor.

* * * * *